United States Patent [19]

Winterburn

[11] Patent Number: 4,759,787
[45] Date of Patent: Jul. 26, 1988

[54] METHOD OF PURIFYING MOLTEN SILICA

[75] Inventor: John A. Winterburn, Tynemouth, United Kingdom

[73] Assignee: TSL Group PLC, Wallsendm, United Kingdom

[21] Appl. No.: 897,636

[22] PCT Filed: Nov. 4, 1985

[86] PCT No.: PCT/GB85/00499
§ 371 Date: Jul. 7, 1986
§ 102(e) Date: Jul. 7, 1986

[87] PCT Pub. No.: WO86/02919
PCT Pub. Date: May 22, 1986

[30] Foreign Application Priority Data

Nov. 5, 1984 [GB] United Kingdom ............... 8427915

[51] Int. Cl.$^4$ .................... C03C 23/00; C03B 19/00; C03B 15/00
[52] U.S. Cl. .................... 65/30.1; 65/30.13; 65/18.4; 65/111; 65/136; 156/602
[58] Field of Search ............ 65/111, 136, 30.1, 30.13, 65/18.1, 18.4; 156/602

[56] References Cited

U.S. PATENT DOCUMENTS

| | | | |
|---|---|---|---|
| 1,910,017 | 5/1933 | Hulin | 204/212 |
| 2,897,126 | 7/1959 | George | 65/111 X |
| 3,051,915 | 8/1962 | Hoover et al. | 65/111 X |
| 3,058,915 | 10/1962 | Bennett | 156/602 |
| 3,811,855 | 5/1974 | Carlson et al. | 65/30.13 |
| 4,014,772 | 3/1977 | Woods et al. | 65/30.1 X |
| 4,416,680 | 11/1983 | Brüning et al. | 65/144 |
| 4,466,820 | 8/1984 | Clarke | 65/30.13 |

FOREIGN PATENT DOCUMENTS

| | | |
|---|---|---|
| 1123264 | 9/1956 | France . |
| 1363233 | 5/1964 | France . |
| 2480272 | 10/1981 | France . |
| 1047390 | 12/1958 | German Democratic Rep. . |
| 59-169956 | 9/1984 | Japan . |
| 1490809 | 11/1977 | United Kingdom . |

Primary Examiner—Arthur Kellogg
Attorney, Agent, or Firm—Michael J. Striker

[57] ABSTRACT

An improved quality vitreous silica boby and/or improved quality product made at high temperature in a vitreous silica vessel is/are obtained by applying a polarizing potential across the boundary surfaces of the vitreous silica body or vessel to cause migration of impurity ions away from one of the boundary surfaces thereof. Single crystal silicon (10) of reduced alkali content is drawn from melt (12) in a vitreous silica crucible (14) with a polarizing voltage applied across the wall of the crucible.

4 Claims, 1 Drawing Sheet

METHOD OF PURIFYING MOLTEN SILICA

This invention relates to a method of improving the quality of a product made from or made in contact with a body of vitreous silica.

In one aspect, the invention relates to a method of making an improved vitreous silica product, such as a crucible, a tube or a plate, having a reduced impurity content, and to a product produced by the method.

The invention also relates to an improved method for using a vitreous silica vessel for the high temperature processing of a material contained therein. Particularly valuable uses of this method of the invention are found in the treatment of molten semiconductor materials in a vitreous silica crucible (e.g. in the drawing of a single crystal of silicon).

DISCUSSION OF PRIOR ART

An arc moulded crucible (AMC) is normally produced by fusing a powder material under the influence of an electrical arc while the powder material (e.g. quartz powder) is held in place in a rotating mould (e.g. of water cooled metal) by centrifugal force, with or without the application of a vacuum via the mould wall(s).

A vitreous silica crucible is commonly used to contain a melt from which a single crystal is drawn. In the case of semiconductor materials, high purity is of vital importance and much effort has been, and is still being, given to avoiding impurity contamination of the melt during the crystal pulling operation. The crucible is one potential source of such contamination.

In the case of the pulling of a silicon crystal from melt in a vitreous silica crucible, alkali impurities may transfer to the molten silicon from the wall(s) of the crucible and a variety of different, often time-consuming and otherwise expensive, procedures have been proposed for the purification of the starting material used for a vitreous silica crucible to reduce the alkali impurities therein.

It has now been discovered that a reduced impurity content in material fused in a vitreous silica crucible can be obtained by the simple expedient of applying a polarising potential across the wall(s) of the crucible, at least while the latter is at a temperature in excess of 700° C., for such a period and with such a polarity that ions of the or each impurity will migrate across the wall(s) of the crucible away from the inside surface thereof.

Impurity migration can be effected when the crucible is first fused from the starting material and/or by applying a correctly polarised potential across the wall(s) of the crucible when it contains melt. In the case of alkali impurity ions (which so far appear to be the impurities most easily removed from the crucible wall/melt interface) a voltage with positive polarity on the inside and negative polarity on the outside of the crucible will be required. Voltages between 1 and 2000 volts appear to be effective over the temperatures and times typical for pulling a single crystal from a bath of molten semiconductor material. The migration rate is a function of temperature and applied voltage and preferably the temperature of the inside surface of the crucible wall(s) is in excess of 900° C.

The crucible wall(s) is/are not a significant barrier to the diffusion of impurities (e.g. Na, K or Li) which in the absence of an electrolysing potential may migrate through the wall(s) from the crucible holder, and which in the presence of an electrolysing potential can migrate into the wall(s) from melt in the crucible.

Although the invention is thought to have an important commercial impact in the areas of the high temperature production of products from vitreous silica vessels and the manufacture of such vessels with reduced alkali impurity content, it will be appreciated that vitreous silica tubing whose impurity content has been reduced by electrolysis can have other useful applications than as an intermediary in the manufacture of a vitreous silica vessel.

Hence it should be appreciated that the invention also extends to the production of improved vitreous silica products (e.g. tubing) either by a one-stage process in which an ion-migrating potential is applied across the product during manufacture, or by a two-stage process in which an ion-migrating potential is applied across a heated billet prior to further processing (e.g. drawing) with or without further electrolysis during that further processing.

Once ion migration in a vitreous silica body has been achieved using the principles described herein, it would often be desirable to remove any ion-enhanced region from the body so that even if back diffusion should subsequently occur, there will be a net improvement in impurity content of the vitreous silica body.

SUMMARY OF THE INVENTION

Thus, in its broadest aspect, the present invention relates to a method of improving the quality of a product made from, or made in contact with, a body of vitreous silica, which is characterised in that impurity ions are made to migrate away from one boundary surface of the body towards an opposite boundary surface thereof by applying a polarising potential across the boundary surfaces of the body while the body is maintained at a temperature above 700° C.

The polarising potential is typically poled to make alkali metal ions migrate away from the said one boundary surface. Typical temperatures are in the range 800° to 2000° C., typical process times are from one to a few tens of hours at the lower end of the range and a few minutes to an hour at higher temperatures and typical polarising potentials from a few tens of volts to a few kilovolts.

The method can be used to make tubing and other vitreous silica products of improved purity.

It is thus feasible to electrolyse tubing during fusing to cause migration of ions away from one wall surface and then to produce the desired product either from a powder starting material taken from ion-depleted regions of the tubing (e.g. by grinding off the ion-rich region(s)), or directly from the electrolysed tubing using ion-depleted regions for the inside walls. Preferably polarising potential should be reapplied every time the wall material is heated above about 750° C. and certainly above 900° C. if some back-diffusion is not to occur but if a sufficient impurity depletion has been achieved during manufacture of the product or its starting material, such back-diffusion may not matter. In practice, however, since electrolysing a vitreous silica vessel during use is neither difficult nor expensive to achieve, it could be employed even where a low-alkali-impurity content vitreous silica material was used in its manufacture.

BRIEF DESCRIPTION OF THE DRAWINGS

The invention will now be more fully described with reference to the accompanying drawings, in which.

DESCRIPTION OF PREFERRED EMBODIMENTS

Figure 1:
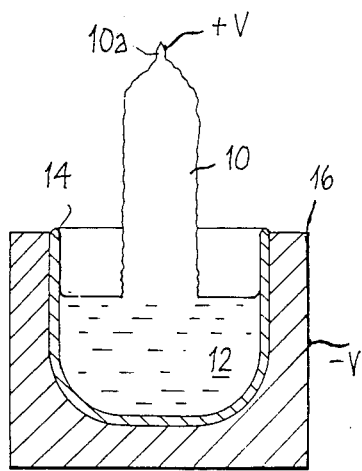
FIG. 1 is a schematic indication of the invention applied to improve single crystal semiconductor material drawn from a vitreous silica crucible and as described in the following Examples 10 to 12.

FIG. 1 shows, purely schematically, a single crystal 10 of silicon being drawn from a bath 12 of molten silicon contained in a vitreous silica arc moulded crucible 14. In the usual way, the crucible 14 is contained within a graphite susceptor 16 heated by an induction coil (not shown) and the crystal 10 depends from a seed crystal 10a which has been slowly drawn upwards out of the surface of the bath 12.

A d.c. potential is applied between the seed crystal 10a and the susceptor 16 with the polarity as shown, this potential being maintained throughout the pulling operation. The magnitude of the applied potential can vary from a minimum which is sufficient to overcome contact resistances and ionisation potentials and establish a current of a few microamps, to a maximum where the high voltage causes arcing or other problems. In practice, a potential of between a few volts and a few hundred volts would normally be used. FIG. 1 is further discussed in the following Examples 10 to 13.

EXAMPLES OF THE INVENTION

Example 1

Figure 2:
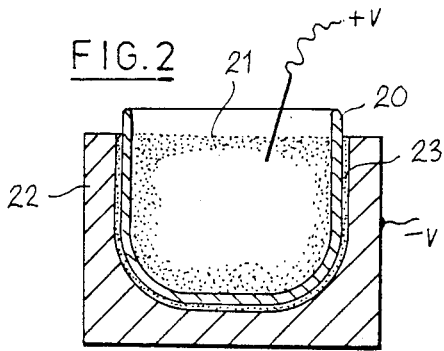
FIG. 2 shows a vitreous silica crucible whose purity has been improved by the method of the invention which is being processed as described in the following Examples 1 and 2.

(see FIG. 2)

A previously manufactured crucible 20 of 300 mm diameter with a 6 mm wall thickness was heated to 1050° C. in nitrogen. An internal electrodes 21, consisting of high purity carbon powder loosely filled into the crucible 20, and an external electrode was provided by a graphite holder 22 into which the crucible 20 fitted loosely. The gap between the holder 22 and the crucible 20 was filled with high purity carbon powder 23. Care was taken to ensure excess carbon powder did not cause short circuits. The upper 10 mm of the crucible protruded above the holder and internal powder fill to act as a barrier to surface tracking by the applied voltage. The holder was made the negative electrode.

The voltage was applied gradually on the crucible reaching 1050° C. to keep the electrolysing current below 50 mA. After 40 minutes, the full voltage of 2.5 KV could be applied.

Electrolysis continued for 4 hours, then the temperature was allowed to drop to room temperature with the full voltage still applied.

Analysis of the crucible material after this treatment is shown in Table 1 as AMC 3.

Example 2

A second crucible was treated as in Example 1 except that the polarising voltage was switched off at 800° C. as the crucible was cooling following electrolysis at 1050° C.

Analysis of the crucible is shown in Table 1 as AMC 4. From the results it can be seen that back diffusion of the alkali ions is insignificant below 800° C.

Example 3

Figure 3:
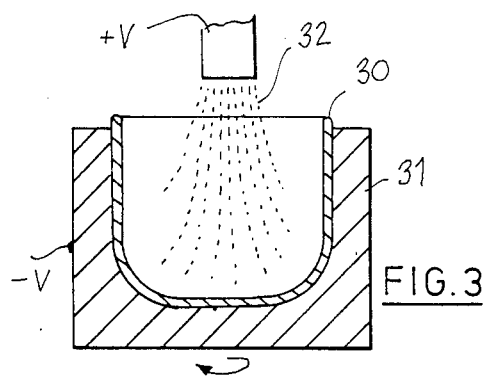
FIG. 3 shows how a vitreous silica crucible can be made in accordance with the invention in the manner described in the following Examples 3 and 4.

(see FIG. 3)

A further crucible 30 was heated directly in a spinning graphite mould 31 using an oxy propane flame 32 so that the crucible softened and came into intimate contact with the mould. The mould was made negative and the burner positive using a voltage of 3.8 KV. The high electrical impedance of the flame greatly reduced the voltage available for electrolysis but some improvement was measured as can be seen from the figures shown in Table 1 as AMC 10. The time of electrolysis was 5 minutes.

Example 4

A further crucible was treated as in Example 3 except that an R.F. induction plasma replaced the flame 32. The analysis of this treated crucible is shown as AMC 14 in Table 1.

Example 5

Figure 4:
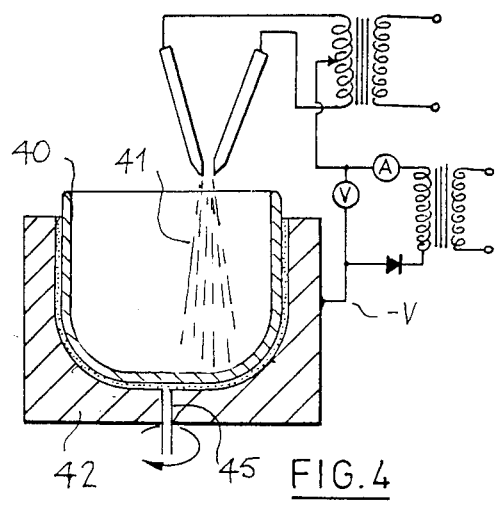
FIGS. 4 and 5 show a crucible being made in the manner described, respectively, in the following Examples 5 to 7 and Example 8.

(see FIG. 4)

A crucible 40 was manufactured using the spinning mould method to hold high purity quartz powder in position. Heating was with an arc 41 and the mould 42 was of water-cooled metal. An electrolysing voltage of 10 KV was applied for the final 2 minutes of heating using the arc 41 as the positive electrode and the mould 42 as the negative electrode. The analytical result is shown as AMC 21 in Table 1.

Example 6

A crucible was manufactured as for Example 5 except that an uncooled graphite mould was used in place of the water-cooled mould 42. The analytical result is shown in Table 1 as AMC 23. The improved result when compared with Example 5 is believed to be due to the higher electrical resistance of the quartz powder kept cold by the water-cooled mould in Example 5, reducing the voltage available for electrolysis.

Example 7

A crucible was manufactured as for Example 6 except that during fusion a partial vacuum of 8–7 kPa was applied between the mould 42 and the forming crucible 40 via a pipe 45.

The analytical result is shown as AMC 31. The lower impurity content in this case is believed to be due to partial ionisation of the gas in the gap between the mould and the forming crucible due to the partial vacuum and this ionised gas acting as the negative electrode.

TABLE 1

| Crucible | Position | Surface | Na$_2$O | K$_2$O | Li$_2$O |
|---|---|---|---|---|---|
| AMC3 | Side | Inner | <0.1 | <0.1 | <0.1 |
|  | Wall | Outer | 1.5 | 4.2 | 3.3 |
|  | Base | Inner | 0.2 | 0.2 | 0.2 |
|  | Wall | Outer | 1.6 | 3.3 | 2.8 |
| AMC4 | Side | Inner | <0.1 | <0.1 | <0.1 |
|  | Wall | Outer | 2.5 | 2.0 | 4.4 |
|  | Base | Inner | <0.1 | <0.1 | <0.1 |
|  | Wall | Outer | 0.1 | 0.2 | 0.3 |
| AMC10 | Mean | Inner | 0.9 | 1.5 | 0.2 |
|  | Value | Outer | 2.2 | 2.0 | 2.0 |
| AMC14 | Mean | Inner | <0.1 | <0.1 | <0.1 |
|  | Value | Outer | 0.2 | 0.4 | 0.2 |
| AMC21 | Mean | Inner | 0.9 | 1.2 | 0.2 |
|  | Value | Outer | 1.4 | 2.5 | 2.0 |
| AMC23 | Mean | Inner | 0.2 | 1.3 | <0.1 |
|  | Value | Outer | 0.9 | 2.5 | 0.5 |
| AMC31 | Mean | Inner | <0.1 | 0.2 | <0.1 |
|  | Value | Outer | 0.1 | 0.4 | 0.1 |
| AMC33 | Mean | Inner | <0.1 | <0.1 | <0.1 |
|  | Value | Outer | 0.2 | 0.5 | <0.1 |
| Starting Material for AMC 3, 4, 10, 14 | | | 5.6 | 5.4 | 3.8 |
| Starting Material for AMC 21, 23, 31 | | | 1.4 | 2.5 | 3.2 |

Example 8

Figure 5:
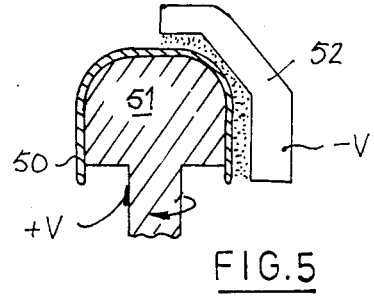

(see FIG. 5)

A manufactured crucible 50 was placed over a closely fitting graphite internal mould 51 and heated externally with an oxy-propane ribbon burner 52. The temperature reached on the surface of the crucible was sufficient to remelt it.

A potential difference was applied between the burner 52 and the mould 51 of 4.5 KV. The mould was rotated at 1 RPM so that the flame swept over all the crucible. The mould was the positive electrode. During the processing it was noted that the flame was coloured by the ions being electrolysed from the crucible.

An additional result of the heating was that the outside of the crucible became glazed.

The analytical results appear in Table 1 as AMC 33.

Example 9

Figure 6:
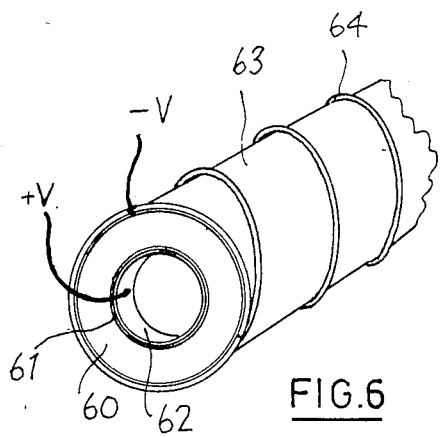
FIG. 6 shows how the quality of vitreous silica tubing can be improved as described in the following

(see FIG. 6)

A cylindrical pipe 60 of fused quartz with an external diameter of 200 mm, a length of 1500 mm and a wall thickness of 25 mm was subject to electrolysis across the wall with a potential difference of 10 KV.

An inner electrode 61 (anode) was made by coating the inner surface with a layer approximately 2 mm thick consisting of a paste of low alkali titanium dioxide (British Titan Products Ltd.—Grade A-HR) and a proprietary low alkali silica sol (Nalfloc Ltd.—"Nalcoag 1034A"). Connection to this electrode was made with a nickel chromium alloy band 62 which was a spring fit in the bore.

An outer electrode (cathode) consisted of a layer 63 approximately 2 mm thick coating the whole outer surface except the ends and consisting of a paste of ferric oxide and a silica sol. Connection to this electrode was made with an open pitch coil 64 of nickel chromium heat resisting wire.

Electrolysis was carried out at 1050° C. On reaching temperature, the voltage was gradually increased so as to avoid exceeding the current limitation of the power supply (100 ma). Maximum voltage of 10 KV was reached after 8 hours 40 minutes.

Electrolysis continued for 30 hours, when the furnace was allowed to cool naturally. The voltage was switched off when the pipe had cooled to 800° C.

The results of the electrolysis are shown as B4 in Table 2.

Example 10

The cylindrical pipe of fused quartz from Example 9 was machined externally to remove 1 mm from the bore and 3 mm from the external surface leaving a wall thickness of 21 mm. After cleaning with detergent and dilute hydrofluoric acid it was reheated in a graphite resistance furnace and drawn into tubing. Some of this tubing was reworked with flames on a glass working lathe to the form of a crucible. The analysis of the crucible is shown in Table 2 as C1.

TABLE 2

|  | Surface | Na$_2$O | K$_2$O | Li$_2$O |
|---|---|---|---|---|
| B4 | Inner | <0.1 | <0.1 | <0.1 |
|  | Centre | <0.1 | <0.1 | <0.1 |
|  | Outer | 13.9 | 4.8 | 8.0 |
| Tube from B4 |  | 0.1 | 0.1 | <0.1 |
| C1 | Inner | <0.1 | <0.1 | <0.1 |
|  | Outer | <0.1 | 0.1 | <0.1 |
| Starting Material for B4 |  | 8.8 | 4.3 | 4.4 |

Example 11

(see FIG. 1)

A single crystal "puller" was modified to allow a voltage to be applied between the silicon single crystal 10a of FIG. 1 and the graphite susceptor 16 during that growing operation which was carried out in Argon at 1 atmosphere gauge. After the crystal 10 had achieved the desired diameter, a voltage of 50–1000 V was applied between the crystal (positive) and the susceptor (negative). The voltage was derived from a current limited source of 0.010A.

Results for the silicon crystal 10 are shown in Table 3.

Example 12

A single crystal was grown as for Example 11 except that a sub-atmospheric pressure of 15–20 torr was used in the puller. The maximum polarising voltage was limited to 200 V.

The results are shown in Table 3 (S2).

Example 13

A single crystal was grown as for Example 11 except that a coating of glassy carbon (obtained by the pyrolysis of propane diluted with Argon) had been made on the outside of the quartz crucible before use in order to improve the electrical contact between the crucible and the susceptor.

The results are shown in Table 3 (S3).

TABLE 3

Resistivity of Single Crystal ohm-cm P.Type Silicon

| | | |
|---|---|---|
| Without polarizing Voltage | | Crystal Shoulder 145 |
| | | Crystal end 115 |
| With polarizing Voltage | S1 | Crystal Shoulder 500 |
| | | Crystal end 300 |
| | S2 | Crystal Shoulder 850 |

TABLE 3-continued

Resistivity of Single Crystal
ohm-cm P.Type Silicon

| | | |
|---|---|---|
| | Crystal end | 600 |
| S3 | Crystal Shoulder | 1250 |
| | Crystal end | 1050 |

From the foregoing Examples, it will be appreciated that the electrolysing temperature and time conditions are related one to the other and to the wall thickness across which the polarising potential is applied. In summary, these process conditions are preferably that the body is maintained for a time of at least 1 hour/mm wall thickness in the temperature range 800°–1200° C. and at least 1 min/mm thickness in the temperature range 1201°–2000° C. The effective polarising potential applied across the boundary surfaces preferably exceeds 10 V/mm thickness but not 1 KV/mm thickness.

I claim:

1. A method of improving the purity of melt contacting an inner wall of a vitreous silica containing vessel, wherein impurity ions in the melt are made to migrate into said inner wall and from the inner wall towards an outer wall of the vessel, by applying a polarizing potential across said walls, the polarizing potential being applied via the melt in a direction to cause impurity ions in the vitreous silica to migrate away from said inner wall while the vessel is maintained at a temperature above 1000° C.

2. The method of claim 1, wherein the melt is a semiconductor material and the polarising potential is applied thereto via a single crystal of the semiconductor material in contact with the melt.

3. The method of claim 1, wherein the vitreous silica vessel has its outer surface in electrical contact with carbon and the polarising potential is applied across the wall of the vessel via the melt and the carbon.

4. The method of claim 1, wherein the polarising potential lies in the range 1 to 2000 volts and the melt is at positive potential relative to the outer wall of the vessel.

* * * * *